(12) United States Patent
Sung et al.

(10) Patent No.: US 12,218,153 B2
(45) Date of Patent: Feb. 4, 2025

(54) DISPLAY DEVICE AND MANUFACTURING METHOD THEREOF

(71) Applicant: Au Optronics Corporation, Hsinchu (TW)

(72) Inventors: Wen-Ching Sung, Hsinchu (TW); Wei-Hung Kuo, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 893 days.

(21) Appl. No.: 17/359,636

(22) Filed: Jun. 27, 2021

(65) Prior Publication Data

US 2022/0208802 A1    Jun. 30, 2022

(30) Foreign Application Priority Data

Dec. 28, 2020    (TW) ................................. 109146506

(51) Int. Cl.
| | |
|---|---|
| *H01L 27/12* | (2006.01) |
| *G03F 7/00* | (2006.01) |
| *G03F 7/16* | (2006.01) |
| *H01L 21/311* | (2006.01) |
| *H01L 25/16* | (2023.01) |
| *H01L 33/38* | (2010.01) |

(52) U.S. Cl.
CPC ........ *H01L 27/1248* (2013.01); *G03F 7/0007* (2013.01); *G03F 7/162* (2013.01); *G03F 7/168* (2013.01); *H01L 21/31133* (2013.01); *H01L 25/167* (2013.01); *H01L 27/1259* (2013.01); *H01L 33/385* (2013.01)

(58) Field of Classification Search
None
See application file for complete search history.

(56) References Cited

U.S. PATENT DOCUMENTS

| | | |
|---|---|---|
| 8,933,444 B2 | 1/2015 | Saito et al. |
| 9,437,742 B2 | 9/2016 | Yan et al. |
| 10,802,163 B2 | 10/2020 | Yi et al. |

(Continued)

FOREIGN PATENT DOCUMENTS

| | | |
|---|---|---|
| CN | 103426898 | 12/2013 |
| CN | 104124277 | 10/2014 |

(Continued)

*Primary Examiner* — Nilufa Rahim
(74) *Attorney, Agent, or Firm* — JCIPRNET

(57) ABSTRACT

A display device and a manufacturing method thereof are provided. The display device includes a display area and a non-display area. The display device includes a substrate, an element layer, an electrode pattern layer, a photoresist pattern layer, and a light-emitting element. The element layer is disposed on the substrate. The electrode pattern layer is disposed on the element layer, and the electrode pattern layer includes multiple electrodes. The photoresist pattern layer is disposed on the electrode pattern layer, and the photoresist pattern layer includes a first photoresist pattern disposed corresponding to the display area and corresponding to the electrodes; a second photoresist pattern disposed corresponding to the non-display area and between the electrodes. The light-emitting element is disposed on the photoresist pattern layer and is electrically connected to the electrodes of the electrode pattern layer.

18 Claims, 11 Drawing Sheets

(56) References Cited

U.S. PATENT DOCUMENTS

| | | |
|---|---|---|
| 2006/0204903 A1 | 9/2006 | Choi et al. |
| 2006/0273716 A1 | 12/2006 | Uhlig et al. |
| 2007/0063640 A1 | 3/2007 | Duineveld et al. |
| 2012/0299038 A1* | 11/2012 | Hwang ................. H01L 33/641 |
| | | 257/E33.062 |
| 2015/0187995 A1* | 7/2015 | Yoneda ................... H01L 33/38 |
| | | 257/98 |
| 2015/0349207 A1* | 12/2015 | Sogo ................... H01L 33/0093 |
| | | 438/33 |
| 2016/0013377 A1* | 1/2016 | Ozeki .................... H01L 24/97 |
| | | 257/48 |
| 2017/0069609 A1 | 3/2017 | Zhang et al. |
| 2017/0269424 A1 | 9/2017 | Long et al. |
| 2017/0358503 A1 | 12/2017 | Liu et al. |
| 2018/0261583 A1 | 9/2018 | Chang et al. |
| 2018/0301442 A1 | 10/2018 | Han et al. |
| 2019/0172978 A1* | 6/2019 | Chen ....................... H01L 33/32 |
| 2020/0152612 A1 | 5/2020 | Chen et al. |
| 2021/0119098 A1* | 4/2021 | Kajiyama ........... H01L 25/0753 |

FOREIGN PATENT DOCUMENTS

| | | |
|---|---|---|
| CN | 104576705 | 4/2015 |
| CN | 108663855 | 10/2018 |
| CN | 108878626 | 11/2018 |
| CN | 110034135 | 7/2019 |
| CN | 111863857 | 10/2020 |

* cited by examiner

DISPLAY DEVICE AND MANUFACTURING METHOD THEREOF

CROSS-REFERENCE TO RELATED APPLICATION

This application claims the priority benefit of Taiwan application serial no. 109146506, filed on Dec. 28, 2020. The entirety of the above-mentioned patent application is hereby incorporated by reference herein and made a part of this specification.

BACKGROUND

Technical Field

The disclosure relates to a display device and a manufacturing method thereof, and more particularly, to a display device with good display quality and a manufacturing method thereof.

Description of Related Art

Currently, the design goals of Micro LED display devices and Mini LED display devices are to dispose a low-reflection layer (e.g., resin black matrix, black metal, etc.) on the non-display area to meet requirements, such as reducing the high reflectivity of the metal traces and being close to an aesthetic taste of dark appearance.

Conventional low-reflection layers can adopt a resin black matrix made in a color filter fab or black metal made in an array fab. With the resin black matrix, a derived cost from the transfer to the color filter fab is generated. With the black metal, an effect of parasitic capacitance is caused since the black metal is a conductor, and an extra photomask process is required.

Moreover, if a resin black matrix or other photoresist materials are adopted as the low reflection layer in the non-display area, a significant height difference of the topography may then occur, likely leading to the mutual interference between the mass transferring and the topography height caused by the protruding height in the subsequent module manufacturing process during the bonding process of the light-emitting diodes and further resulting in poor electrical connection of the light-emitting diodes.

SUMMARY

The disclosure provides a display device including a flat photoresist pattern layer to carry multiple light-emitting elements. When a mass transferring process and a bonding process are performed on the multiple light-emitting elements, the yield of the electrical connection between the light-emitting elements and the electrodes may be improved.

The disclosure provides a manufacturing method of a display device capable of processing the photoresist pattern layer in an array fab without a transfer to a color filter fab, so the cost is saved. In addition, since black metal is not required, no effect of parasitic capacitance is caused, and the photomask process can be omitted.

Based on the above, a display device including a display area and a non-display area is provided in the disclosure. The display device includes a substrate, an element layer, an electrode pattern layer, a photoresist pattern layer, and light-emitting elements. The element layer is disposed on the substrate. The electrode pattern layer is disposed on the element layer, and the electrode pattern layer includes multiple electrodes. The photoresist pattern layer is disposed on the electrode pattern layer. The photoresist pattern layer includes a first photoresist pattern disposed corresponding to the display area and corresponding to the electrodes and a second photoresist pattern disposed corresponding to the non-display area and between the electrodes. The light-emitting element is disposed on the photoresist pattern layer and electrically connected to the electrode of the electrode pattern layer.

In an embodiment of the disclosure, a height of the first photoresist pattern is equal to a height of the second photoresist pattern. The light-emitting element is disposed on a plane of the photoresist pattern layer formed by the first photoresist pattern and the second photoresist pattern.

In an embodiment of the disclosure, the photoresist pattern layer includes an opening to expose the electrodes of the electrode pattern layer. The light-emitting element is electrically connected to the electrodes of the electrode pattern layer through the opening.

In an embodiment of the disclosure, transmittance of a visible light region of the first photoresist pattern ranges from 25% to 100%.

In an embodiment of the disclosure, reflectivity of a visible light region of the first photoresist pattern is less than or equal to 20%.

In an embodiment of the disclosure, transmittance of a visible light region of the second photoresist pattern ranges from 0% to 40%.

In an embodiment of the disclosure, reflectivity of a visible light region of the second photoresist pattern is less than or equal to 15%.

In an embodiment of the disclosure, the light-emitting element includes a micro light-emitting diode (Micro LED) or a sub-millimeter light-emitting diode (Mini LED).

In an embodiment of the disclosure, a material of the photoresist pattern layer is selected from ionomer resin, thermally sensitive resin, thermosetting resin, hydrocarbon resin, acrylonitrile butadiene styrene resin, acrylic resin, fluorocarbon resin, acetal resin, epoxide resin, ion exchange resin, ionic polymer, amino resin, furfural resin, furfural phenol resin, phenolic resin, phenol ether resin, urea-formaldehyde resin, urea resin, carbamide resin, polyvinyl chloride, polyethylene terephthlate, polyamide, ethylene-vinyl alcohol copolymer, ethylene-propylene copolymer, ethylene-tetrafluoroethylene copolymer, melamine-phenol-formaldehyde resin, and combinations thereof.

Based on the above, the disclosure further provides a manufacturing method of a display device including a display area and a non-display area. The manufacturing method of the display device include the following steps. A substrate is disposed. An element layer is formed on the substrate. An electrode pattern layer is formed on the element layer, and the electrode pattern layer includes multiple electrodes. A photoresist layer is formed on the electrode pattern layer. First energy is provided to the photoresist layer corresponding to the display area to form a first photoresist pattern, and the first photoresist pattern is formed corresponding to the multiple electrodes. Second energy is provided to the photoresist layer corresponding to the non-display area to form a second photoresist pattern, and the second photoresist pattern is formed between the multiple electrodes. The first photoresist pattern and the second photoresist pattern form a photoresist pattern layer. A light-emitting element is disposed on the photoresist pattern layer, and the light-emitting element is electrically connected to the multiple electrodes of the electrode pattern layer.

In an embodiment of the disclosure, a first laser with the first energy is disposed, the photoresist layer is scanned to form the first photoresist pattern, and an energy range of the first laser ranges from 20 J/g to 400 J/g. A second laser with the second energy is disposed, the photoresist layer is scanned to form the second photoresist pattern, and an energy range of the second laser ranges from 300 J/g to 100 J/g.

In an embodiment of the disclosure, a first imprinting device with the first energy is disposed, the photoresist layer is imprinted to form the first photoresist pattern, and a temperature of the first imprinting device ranges from 120° C. to 200°. A second imprinting device with the second energy is disposed, the photoresist layer is imprinted to form the second photoresist pattern, and a temperature of the second imprinting device ranges from 150° C. to 300°.

In an embodiment of the disclosure, the following steps are further included. A baking process is performed on the photoresist layer, and a temperature of the baking process ranges from 80° C. to 110° C. After the baking process, the photoresist layer is imprinted through the first imprinting device and the photoresist layer is imprinted through the second imprinting device.

In an embodiment of the disclosure, a height of the first photoresist pattern is equal to a height of the second photoresist pattern. The light-emitting element is disposed on a plane of the photoresist pattern layer formed by the first photoresist pattern and the second photoresist pattern.

In an embodiment of the disclosure, the following steps are further included. A developer is provided to remove part of the photoresist layer and to form an opening to expose the electrodes of the electrode pattern layer. The light-emitting element is electrically connected to the electrode of the electrode pattern layer through the opening.

In an embodiment of the disclosure, transmittance of a visible light region of the first photoresist pattern ranges from 25% to 100%.

In an embodiment of the disclosure, reflectivity of a visible light region of the first photoresist pattern is less than or equal to 20%.

In an embodiment of the disclosure, transmittance of a visible light region of the second photoresist pattern ranges from 0% to 40%.

In an embodiment of the disclosure, reflectivity of a visible light region of the second photoresist pattern is less than or equal to 15%.

In the disclosure, a material of the photoresist pattern layer is selected from ionomer resin, thermally sensitive resin, thermosetting resin, hydrocarbon resin, acrylonitrile butadiene styrene resin, acrylic resin, fluorocarbon resin, acetal resin, epoxide resin, ion exchange resin, ionic polymer, amino resin, furfural resin, furfural phenol resin, phenolic resin, phenol ether resin, urea-formaldehyde resin, urea resin, carbamide resin, polyvinyl chloride, polyethylene terephthlate, polyamide, ethylene-vinyl alcohol copolymer, ethylene-propylene copolymer, ethylene-tetrafluoroethylene copolymer, melamine-phenol-formaldehyde resin, and combinations thereof.

Based on the above, in the embodiments of the disclosure, the display device includes a flat photoresist pattern layer. When a mass transferring process and a bonding process are performed on multiple light-emitting elements, the yield of the electrical connection between the light-emitting elements and the electrodes may be improved. Moreover, the manufacturing method of the display device in the embodiments of the disclosure can be adapted to process the photoresist pattern layer in an array fab; that is, the photoresist pattern layer can be processed without a transfer to a color filter fab, so the cost is saved. In addition, since black metal is not required, no effect of parasitic capacitance is caused, and the photomask process can be omitted.

In order to make the aforementioned features and advantages of the disclosure comprehensible, embodiments accompanied with drawings are described in detail below.

BRIEF DESCRIPTION OF THE DRAWINGS

FIG. 2A to FIG. 6A are schematic top views of part of the manufacturing process of a display device according to an embodiment of the disclosure.

FIG. 2B to FIG. 6B are schematic cross-sectional views along the line AA' of FIG. 2A to FIG. 6A, respectively.

DESCRIPTION OF THE EMBODIMENTS

Figure 1:
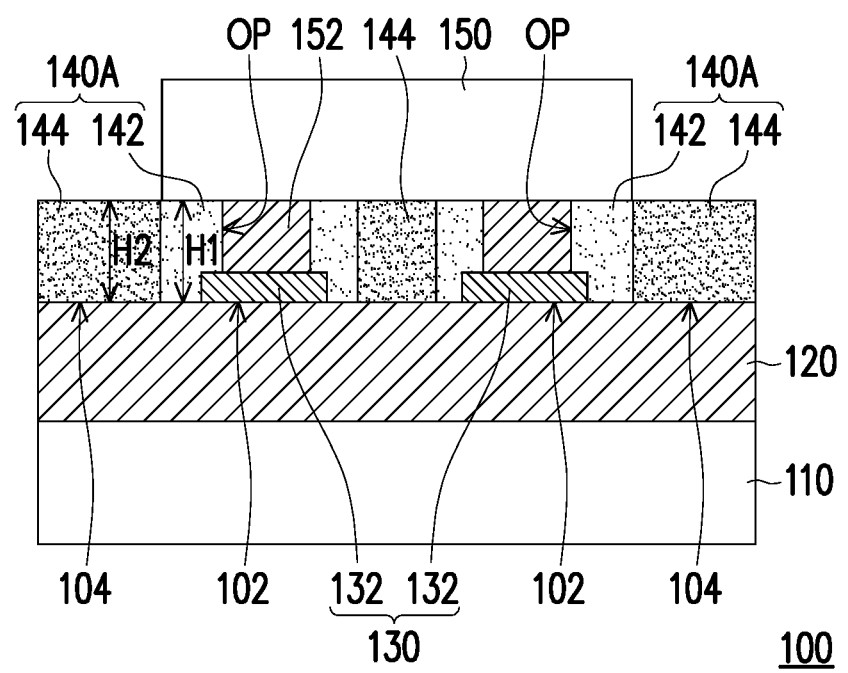
FIG. 1 is a schematic cross-sectional view of a display device according to an embodiment of the disclosure.

FIG. 1 is a schematic cross-sectional view of a display device according to an embodiment of the disclosure. Referring to FIG. 1, a display device 100 has a display area 102 and a non-display area 104. The display device 100 includes a substrate 110, an element layer 120, an electrode pattern layer 130, a photoresist pattern layer 140A, and a light-emitting element 150. The element layer 120 is disposed on the substrate 110. The electrode pattern layer 130 is disposed on the element layer 120, and the electrode pattern layer 130 has multiple electrodes 132. The photoresist pattern layer 140A is disposed on the electrode pattern layer 130. The photoresist pattern layer 140A has a first photoresist pattern 142 and a second photoresist patter 144. The first photoresist pattern 142 is disposed corresponding to the display area 102 and disposed corresponding to the electrode 132. The second photoresist pattern 144 is disposed corresponding to the non-display area 104 and disposed between the electrodes 132. The light-emitting element 150 is disposed on the photoresist pattern layer 140A and is electrically connected to the electrode 132 of the electrode pattern layer 130.

Referring to FIG. 1, the light-emitting element 150 may be disposed in the display area 102 of the display device 100 to serve as the display pixels of the display device 100. The light-emitting element 150 may include a micro light-emitting diode (Micro LED) or a sub-millimeter light-emitting diode (Mini LED). In FIG. 1, only one light-emitting element 150 with two pins 152 is shown. However, the type (e.g., with a single pin, two pins, or multiple pins) and the quantity of the light-emitting elements 150 are not limited thereto in the embodiments of the disclosure. By disposing multiple light-emitting elements 150 in the display area 102 as display pixels, the display device 100 with flexibility and fine screen may be processed.

The non-display area 104 of the display device 100 usually corresponds to a position where metal traces (not shown) are disposed. The metal traces are adapted to electrically connect multiple light-emitting elements 150 in the display area 102 and to drive the driving chips (not shown) of the light-emitting elements 150. Since the second photoresist pattern 144 is disposed in the non-display area 104 of the display device 100, the metal traces may be shielded to reduce the high reflectivity of the metal traces, and the appearance of the display device 100 may be close to the aesthetic taste of dark appearance.

The material of the substrate 110 may include glass, quartz, or other suitable materials. The element layer 120 may include multiple active elements (not shown), such as a thin film transistor. The active element in the element layer 120 may be served as a switch and electrically connected to the pin 152 of the light-emitting element 150 through the electrode 132 of the electrode pattern layer 130, thereby controlling the on or off of the light-emitting element 150. The type or the quantity of circuit elements disposed in the element layer 120 may be selected according to design requirements, which is not limited thereto in the embodiments of the disclosure.

Referring to FIG. 1, in the display device 100, a low-reflective resist is adopted to process the photoresist pattern layer 140A. Low energy or a low temperature may be provided to the low-reflective resist, so the low-reflective resist undergoes a low degree of polymerization reaction, and the first photoresist pattern 142 (having higher transmittance and higher reflectivity) is formed in a position corresponding to the display area 102. In an embodiment, the transmittance of the visible light region of the first photoresist pattern 142 may range from 25% to 100%. The reflectivity of the visible light region of the first photoresist pattern 142 may be less than or equal to 20%. Accordingly, the light emitted by the light-emitting element 150 disposed in the display area 102 may be smoothly output from the display device 100 to present a display screen with good brightness and color.

Moreover, high energy or a high temperature may also be provided to the low-reflective resist, so the low-reflective resist undergoes a high degree of polymerization reaction, and the second photoresist pattern 144 (having lower transmittance and lower reflectivity) is formed in a position corresponding to the non-display area 104. In an embodiment, the transmittance of the visible light region of the second photoresist pattern 144 may range from 0% to 40%; and the reflectivity of the visible light region of the second photoresist pattern 144 may be less than or equal to 15%. Accordingly, the second photoresist pattern 144 disposed in the non-display area 104 may be served as a black matrix to shield the metal traces (not shown) in the non-display area 104, the light reflected by the metal traces in the non-display area 104 may be reduced to provide a display screen with good contrast, and this makes it possible for the appearance of the display device 100 to come with the good aesthetic taste of dark appearance.

Referring to FIG. 1, a height H1 of the first photoresist pattern 142 is equal to a height H2 of the second photoresist pattern 144. The light-emitting element 150 is disposed on the plane of the photoresist pattern layer 140A formed by the first photoresist pattern 142 and the second photoresist pattern 144. The photoresist pattern layer 140A formed by the first photoresist pattern 142 and the second photoresist pattern 144 has a flat topography, so when the mass transferring process and the bonding process are performed on multiple light-emitting elements 150, the yield of the electrical connection between the light-emitting elements 150 and the electrodes 132 may be improved.

Referring to FIG. 1, the photoresist pattern layer 140A may have openings OP to expose the electrodes 132 of the electrode pattern layer 130. The light-emitting element 150 may be electrically connected to the electrode 132 of the electrode pattern layer 130 through an opening OP. Note that the pins 152 of the light-emitting element 150 may be inserted into the opening OP of the photoresist pattern layer 140A, so the light-emitting element 150 may be stably held on the photoresist pattern layer 140A. In FIG. 1, two openings OP are shown, but the quantity of the openings OP is not limited thereto in the embodiments of the disclosure, and the quantity of the openings OP can be appropriately set according to the type (e.g. the quantity of pins) of light-emitting elements 150.

In an embodiment of the disclosure, the material of the photoresist pattern layer 140A is selected from ionomer resin, thermally sensitive resin, thermosetting resin, hydrocarbon resin, acrylonitrile butadiene styrene resin, acrylic resin, fluorocarbon resin, acetal resin, epoxide resin, ion exchange resin, ionic polymer, amino resin, furfural resin, furfural phenol resin, phenolic resin, phenol ether resin, urea-formaldehyde resin, urea resin, carbamide resin, polyvinyl chloride, polyethylene terephthlate, polyamide, ethylene-vinyl alcohol copolymer, ethylene-propylene copolymer, ethylene-tetrafluoroethylene copolymer, melamine-phenol-formaldehyde resin, and combinations thereof.

In the display device 100 of an embodiment in the disclosure, the multiple low-reflective resist materials can be adopted to form a uniform film layer with a flat topography, adapted for carrying multiple light-emitting elements 150 (e.g. Micro LEDs or Mini LEDs). Moreover, by providing different regions of the uniform film layer with different levels of energy, the photoresist pattern layer 140A having different transmittance and reflectivity may be processed in different regions. Subsequently, a manufacturing method of the display device 100 according to an embodiment of the disclosure is illustrated.

FIG. 2A to FIG. 6A are schematic top views of part of the manufacturing process of a display device according to an embodiment of the disclosure. FIG. 2B to FIG. 6B are schematic cross-sectional views along the line AA' of FIG. 2A to FIG. 6A. Refer to FIG. 1, FIG. 2A to FIG. 6A, and FIG. 2B to FIG. 6B altogether to understand the manufacturing method of the display device 100 according to an embodiment of the disclosure.

Figure 2A:
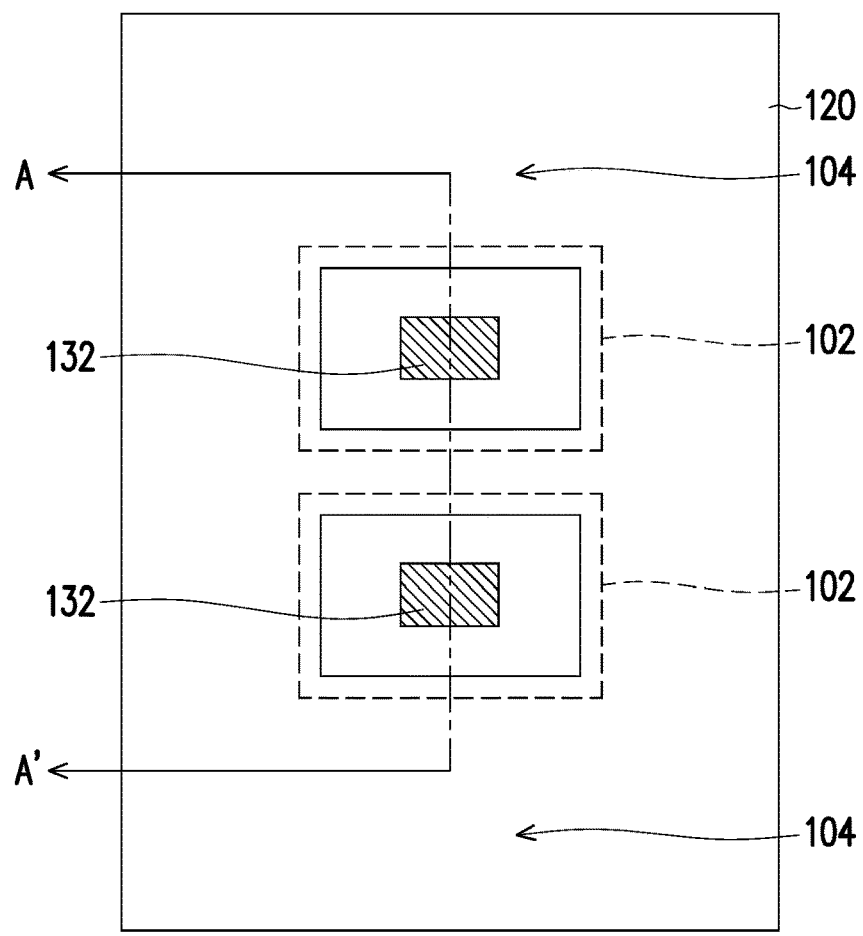
Figure 2B:
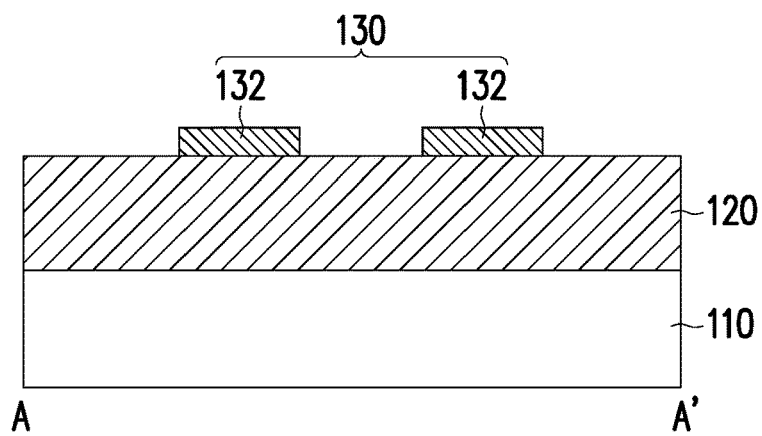

First, referring to FIG. 2A and FIG. 2B, the following steps are performed. A substrate 110 is disposed, an element layer 120 is formed on the substrate 110, an electrode pattern layer 130 is formed on the element layer 120, and the electrode pattern layer 130 has multiple electrodes 132. A thin film deposition process, a photomask process, and an etching process may be adopted to form the element layer 120 having multiple active elements (e.g. thin film transistors) on the substrate 110. After the element layer 120 is formed, the thin film deposition process, the photomask process, and the etching process may be adopted again to form multiple electrodes 132 of the electrode pattern layer 130 on the element layer 120.

Figure 3A:
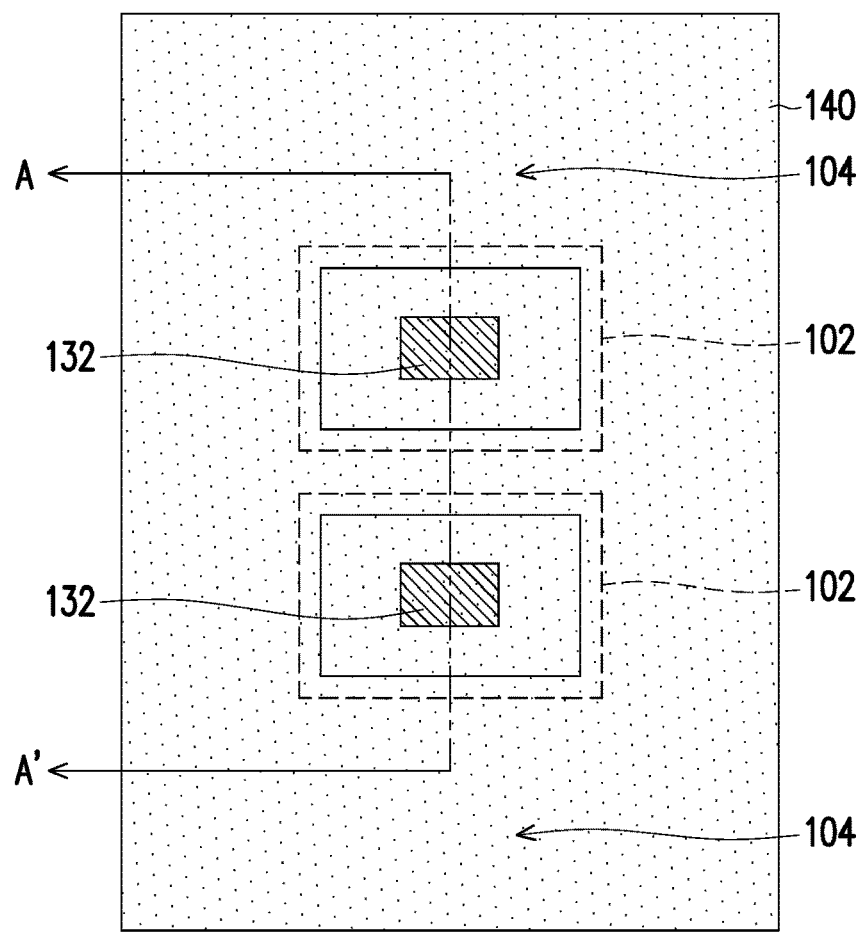
Figure 3B:
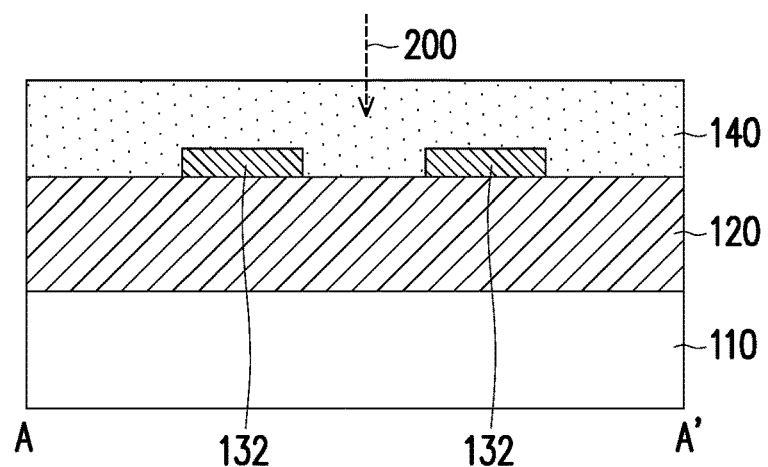

Next, referring to FIG. 3A and FIG. 3B, a photoresist layer 140 is formed on the electrode pattern layer 130. A coating process 200 can be adopted to coat the low-reflective resist on the electrode pattern layer 130 to form the photoresist layer 140. The coating process 200 may be a spin coating process or other suitable methods.

Figure 4A:
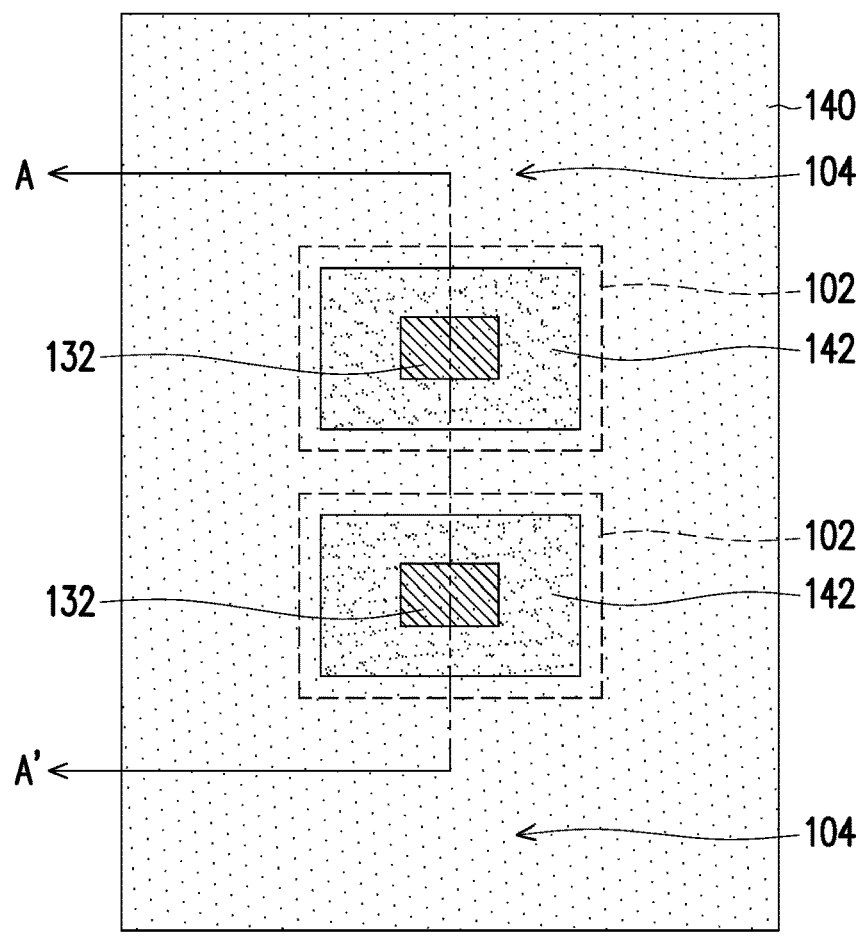
Figure 4B:
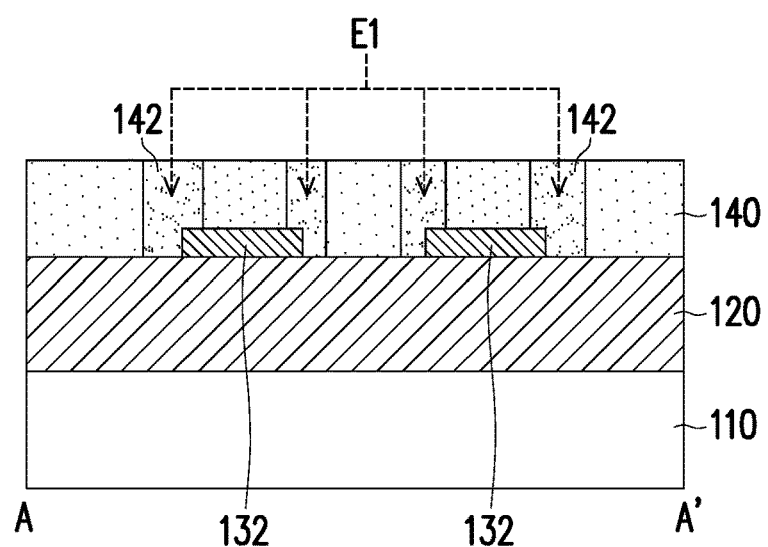

Next, referring to FIG. 4A and FIG. 4B, first energy E1 is provided to the photoresist layer 140 disposed corresponding to the display area 102 to form a first photoresist pattern 142, and the first photoresist pattern 142 is formed corresponding to the electrode 132. In the embodiments of the disclosure, the form of the first energy E1 is not limited. As shown in FIG. 4A, the first photoresist pattern 142 surrounds the electrode 132 disposed in the display area 102.

Figure 5A:
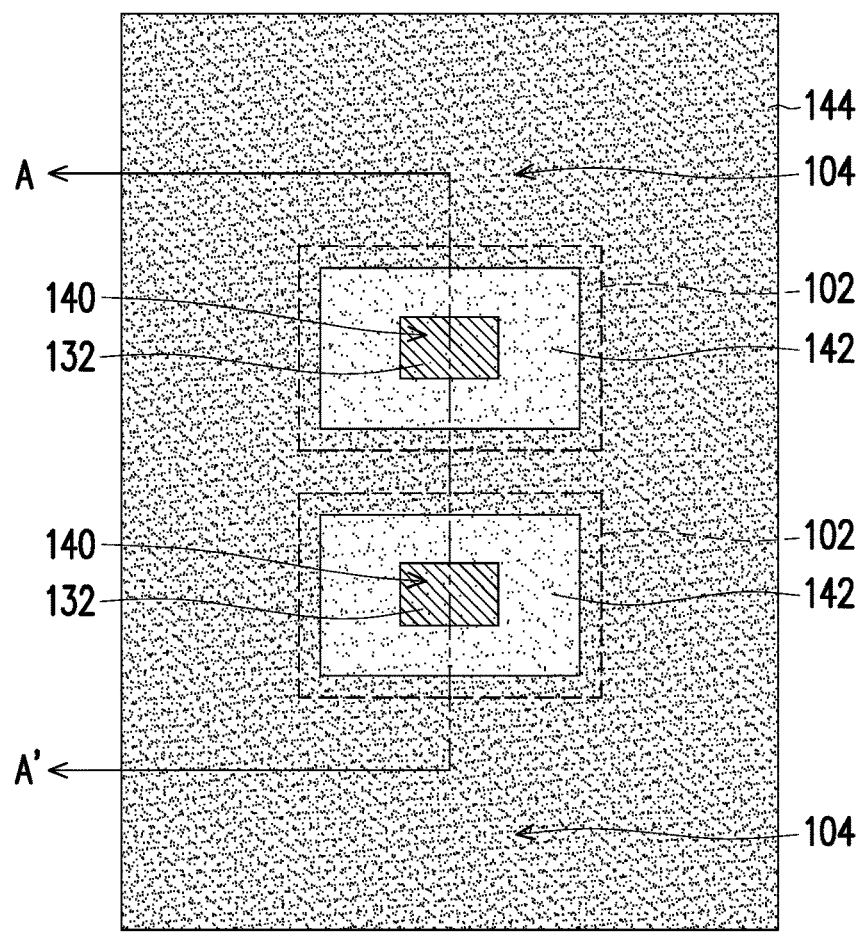
Figure 5B:
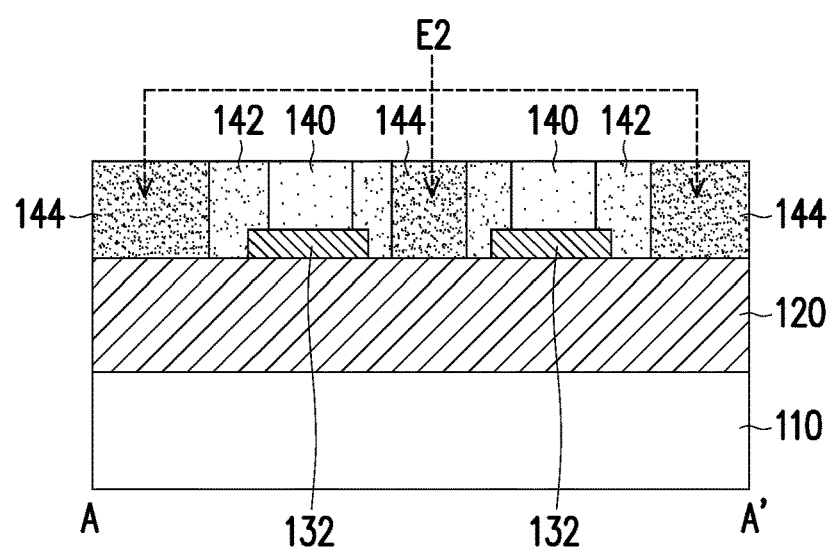

Next, referring to FIG. 5A and FIG. 5B, second energy E2 is provided to the photoresist layer 140 disposed corresponding to the non-display area 104 to form the second photoresist pattern 144, the second photoresist pattern 144 is formed between the electrodes 132, and the first photoresist pattern 142 and the second photoresist pattern 144 form the photoresist pattern layer 140A. In the embodiments of the disclosure, the form of the second energy E2 is not limited. As shown in FIG. 5A, the second photoresist pattern 144 is disposed corresponding to all the non-display areas 104, the first photoresist pattern 142 surrounds the electrode 132 disposed in the display area 102, and the photoresist layer 140 above the electrode 132 does not receive energy and almost does not undergo polymerization reaction.

Figure 6A:
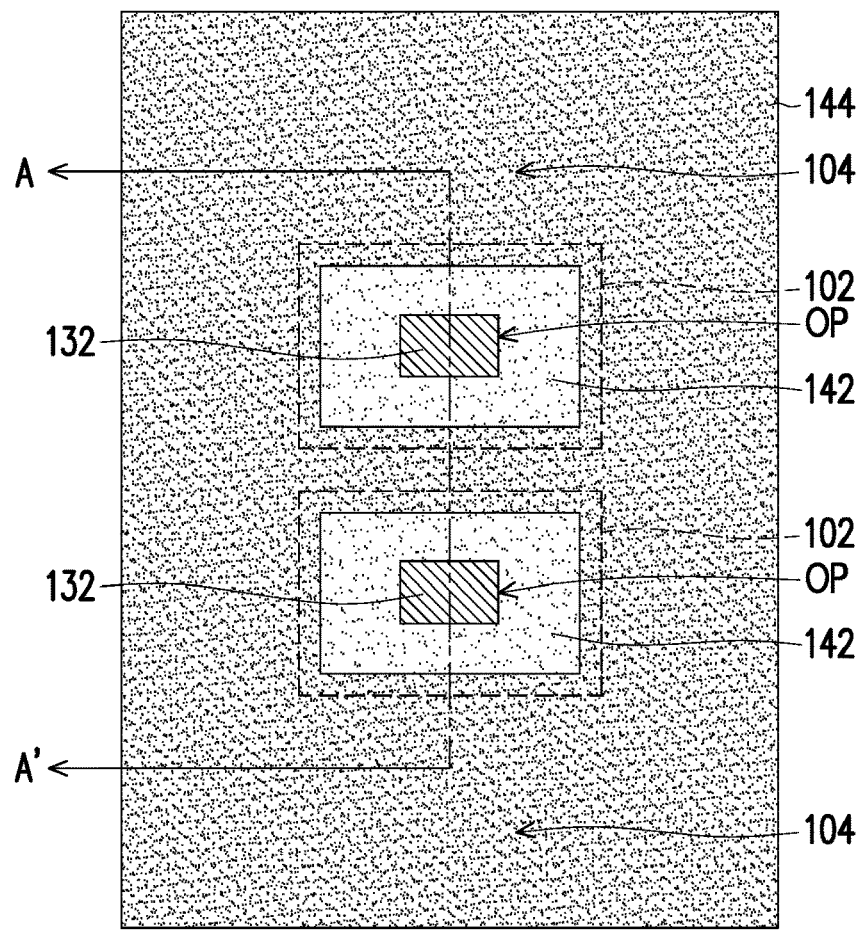
Figure 6B:
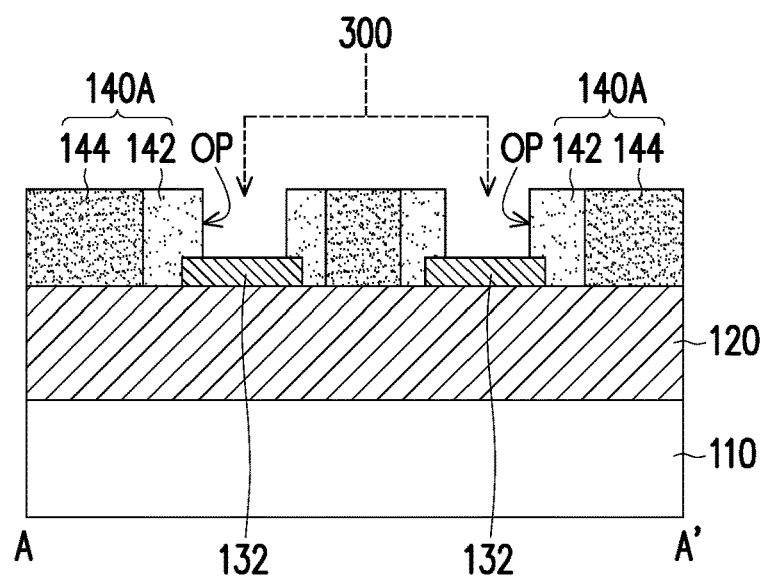

Referring to FIG. 6A and FIG. 6B, a developer 300 may be provided to remove part of the photoresist layer 140 to form the openings OP to expose the electrodes 132 of the electrode pattern layer 130. The developer 300 mainly reacts with the photoresist layer 140 above the electrode 132 to remove the photoresist layer 140.

Subsequently, referring to FIG. 1, the light-emitting element 150 is disposed on the photoresist pattern layer 140A, and the light-emitting element 150 is electrically connected to the electrode 132 of the electrode pattern layer 130. Note that, as shown in FIG. 1, the pins 152 of the light-emitting element 150 are electrically connected to the electrode 132 of the electrode pattern layer 130 through the opening OP. Accordingly, the processing of the display device 100 is completed.

The whole manufacturing process can be performed in an Array Fab; in other words, the manufacturing process processes the photoresist pattern layer 140A with the low-reflective resist without a transfer to the color filter fab, so the cost can be saved. Moreover, since there is no need to adopt black metal, no effect of parasitic capacitance is caused, and no photomask process is required.

FIG. 7A to FIG. 7D are schematic cross-sectional views of part of the manufacturing process of a display device according to another embodiment of the disclosure. An embodiment of forming the photoresist pattern layer 140A is illustrated in FIG. 7A to FIG. 7D. In the embodiment, non-contact laser direct imaging (LDI) technology can be adopted to scan the photoresist layer 140 to form the photoresist pattern layer 140A, and the details are illustrated in the subsequent paragraphs.

Figure 7A:
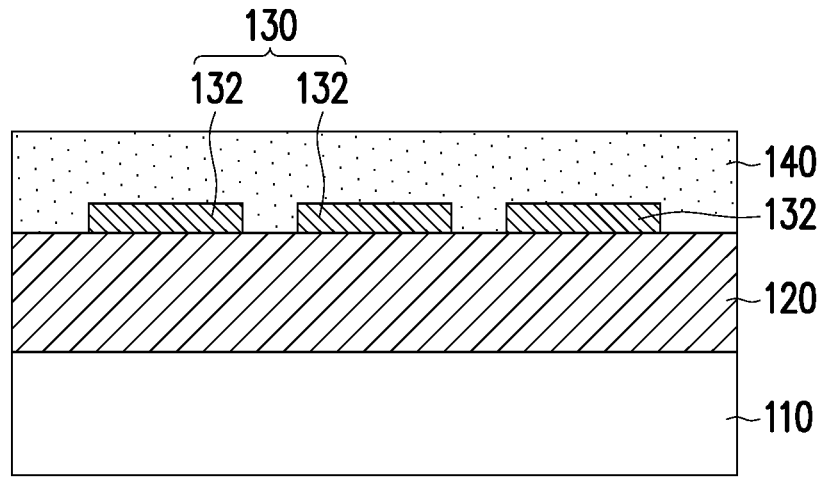
FIG. 7A to FIG. 7D are schematic cross-sectional views of part of the manufacturing process of a display device according to another embodiment of the disclosure.

First, referring to FIG. 7A, the element layer 120 and the electrode pattern layer 130 (with the electrodes 132) are sequentially formed on the substrate 110. Next, the photoresist layer 140 is formed on the electrode pattern layer 130. A spin coating process can be adopted to coat a low-reflective resist on the electrode pattern layer 130 to form the photoresist layer 140.

Figure 7B:
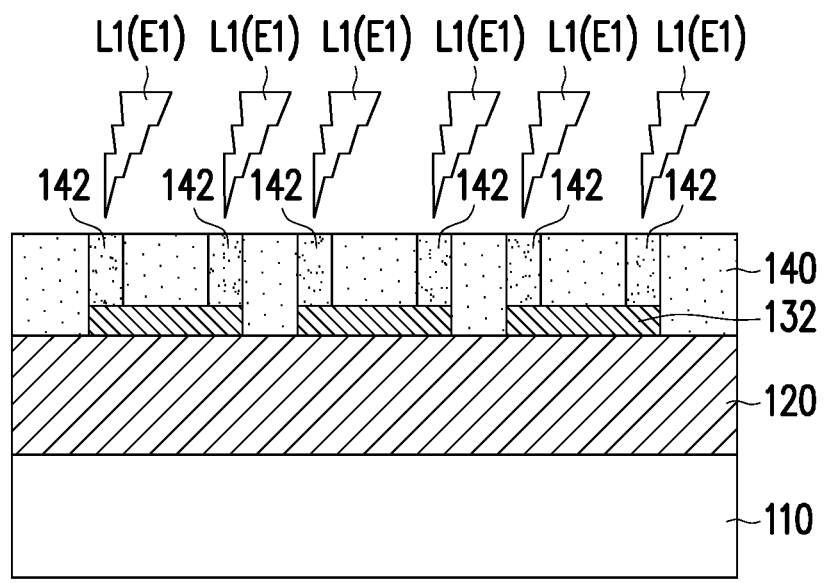

Next, referring to FIG. 7B, a first laser L1 with the first energy E1 is disposed, and the photoresist layer 140 is scanned to form the first photoresist pattern 142. The energy range of the first laser L1 ranges from 20 J/g to 400 J/g. The unit of the energy range is defined as "the energy (measured in unit of joule) absorbed by per gram of photoresist material". With the first laser L1 in the lower energy range, the relatively transparent first photoresist pattern 142 (having higher transmittance and higher reflectivity) of the photoresist layer 140 may be formed.

Figure 7C:
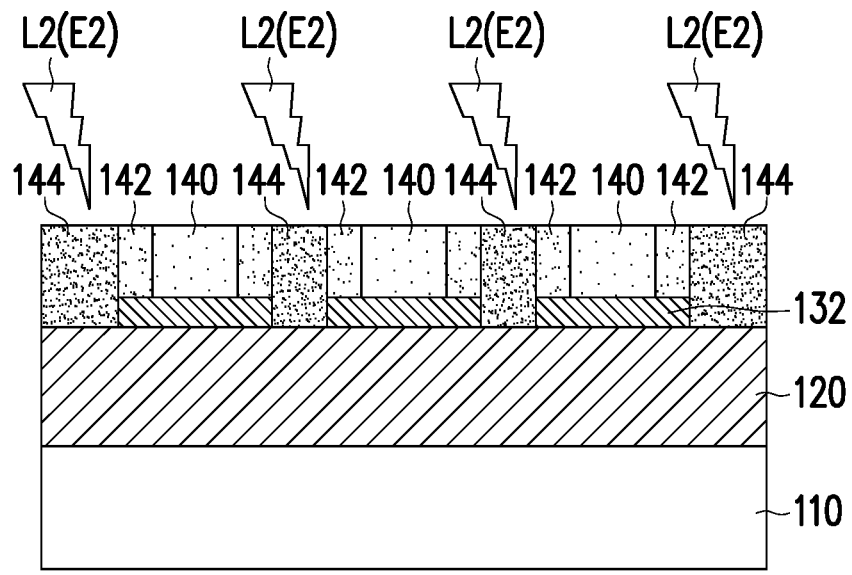

Next, referring to FIG. 7C, a second laser L2 with the second energy E2 is disposed, and the photoresist layer 140 is scanned to form the second photoresist pattern 144. The energy range of the second laser L2 ranges from 300 J/g to 100 J/g. With the second laser L2 in the higher energy range, the near-black second photoresist pattern 144 (having lower transmittance and lower reflectivity) of the photoresist layer 140 may be formed.

Figure 7D:
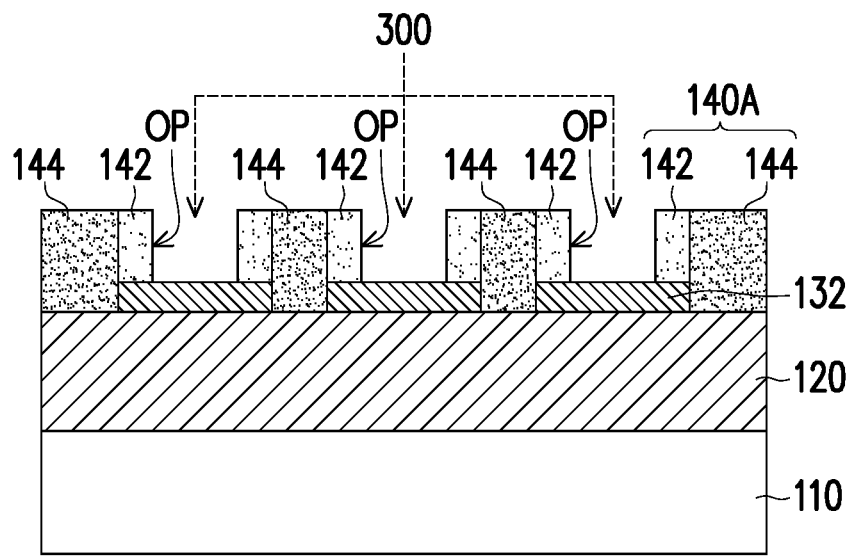

Next, referring to FIG. 7D, the developer 300 may be further provided to remove part of the photoresist layer 140 to form the openings OP to expose the electrodes 132 of the electrode pattern layer 130.

In the embodiment of FIG. 7A to FIG. 7D, the laser direct imaging technology (non-contact laser patterning) is adopted to scan the photoresist layer 140 to form the first photoresist pattern 142 and the second photoresist pattern 144 in the photoresist layer 140. The first laser L1 and the second laser L2 may be ultraviolet lasers. With such a laser scanning process, the fine-sized first photoresist pattern 142 and the fine-sized second photoresist pattern 144 can be produced, and they can be relatively compatible with the small-sized light-emitting elements 150 (e.g. Micro LEDs or Mini LEDs) in the subsequent manufacturing process.

FIG. 8A to FIG. 8E are schematic cross-sectional views of part of the manufacturing process of a display device according to yet another embodiment of the disclosure. Another embodiment of forming the photoresist pattern layer 140A is illustrated in FIG. 8A to FIG. 8E. In the embodiment, a contact-type high-temperature patterning machine can be adopted to imprint the photoresist layer 140 to form the photoresist pattern layer 140A. The details are further illustrated in the subsequent paragraphs.

Figure 8A:
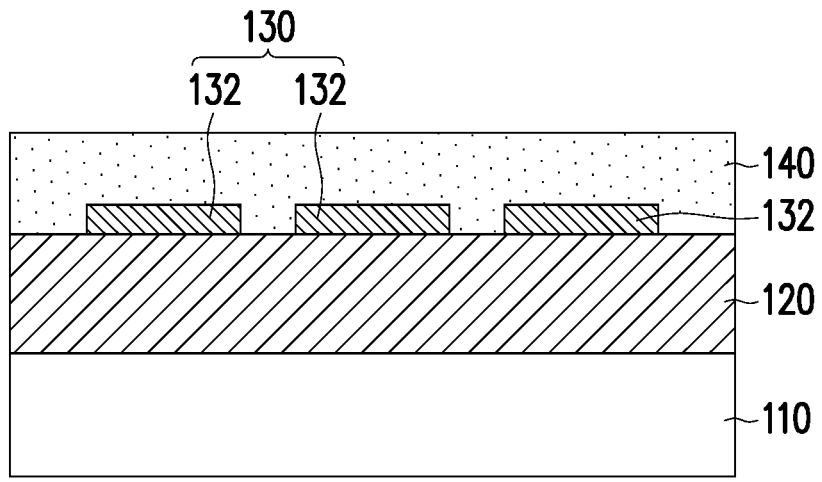
FIG. 8A to FIG. 8E are schematic cross-sectional views of part of the manufacturing process of a display device according to yet another embodiment of the disclosure.

First, referring to FIG. 8A, the element layer 120 and the electrode pattern layer 130 (with the electrodes 132) are sequentially formed on the substrate 110. Next, the photoresist layer 140 is formed on the electrode pattern layer 130. The spin coating process can be adopted to coat a low-reflective resist on the electrode pattern layer 130 to form the photoresist layer 140.

Figure 8B:
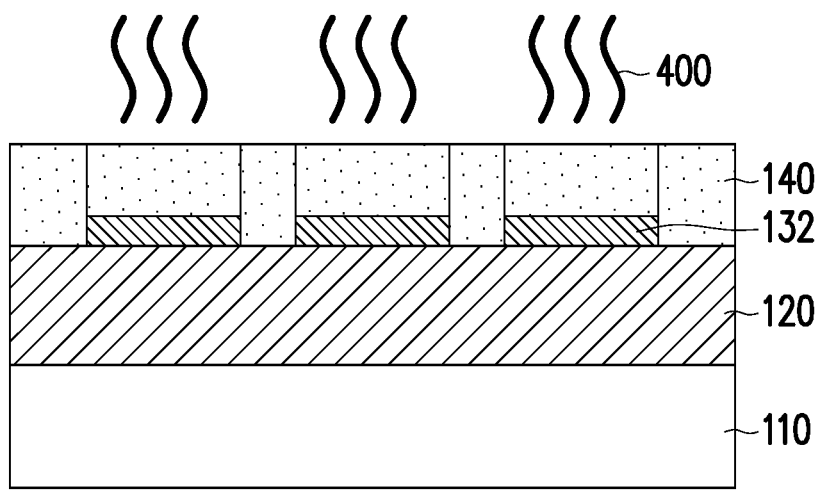

Referring to FIG. 8B, a baking process 400 may be performed on the photoresist layer 140 to remove the solvent in the photoresist layer 140, and the photoresist layer 140 is properly hardened. The temperature of the baking process 400 ranges from 80° C. to 110° C. After the baking process 400, subsequently the photoresist layer 140 is imprinted by a first imprinting device 502, and the photoresist layer 140 is imprinted by a second imprinting device 504.

Figure 8C:
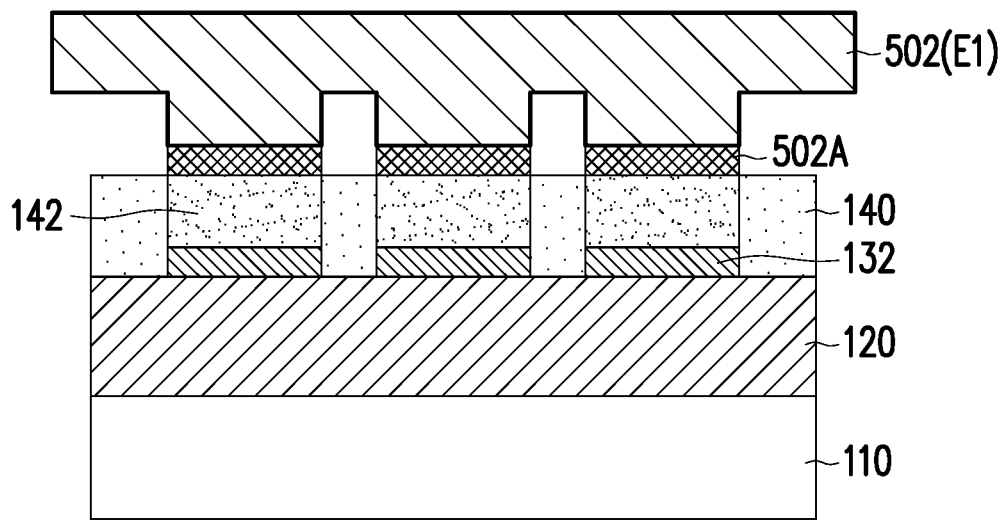

Next, referring to FIG. 8C, the first imprinting device 502 with the first energy E1 is disposed to imprint the photoresist layer 140 to form the first photoresist pattern 142. The temperature of the first imprinting device 502 ranges from 120° C. to 200° C. As shown in FIG. 8C, the first imprinting device 502 is in contact with the photoresist layer 140 at a contact position 502A. With the first imprinting device 502 in the lower temperature range, the relatively transparent first photoresist pattern 142 (having higher transmittance and higher reflectivity) of the photoresist layer 140 may be formed.

Figure 8D:
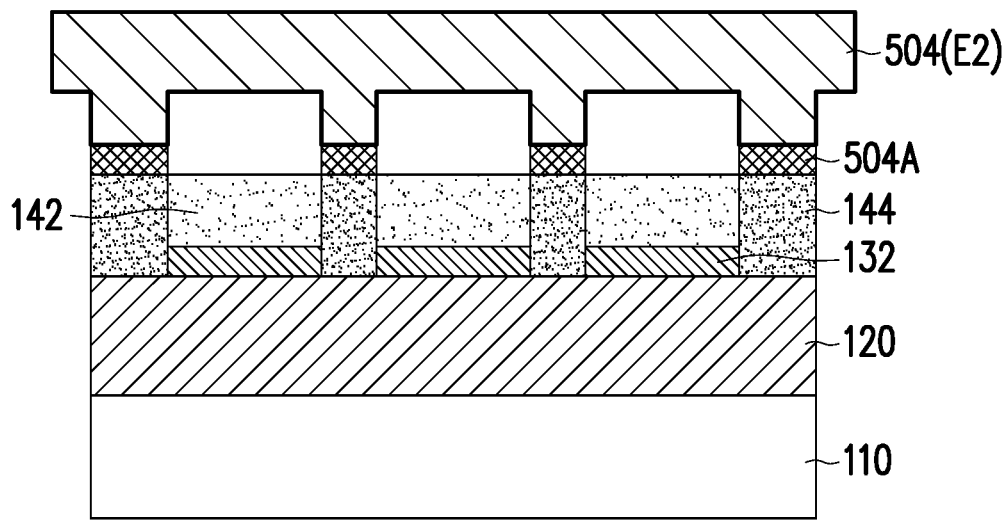

Next, referring to FIG. 8D, the second imprinting device 504 with the second energy E2 is disposed to imprint the photoresist layer 140 to form the second photoresist pattern 144. The temperature of the second imprinting device 504 ranges from 150° C. to 300° C. As shown in FIG. 8D, the second imprinting device 504 is in contact with the photoresist layer 140 at a contact position 504A. With the second imprinting device 504 in the higher temperature range, the near-black second photoresist pattern 144 (having lower transmittance and lower reflectivity) of the photoresist layer 140 may be formed.

Figure 8E:
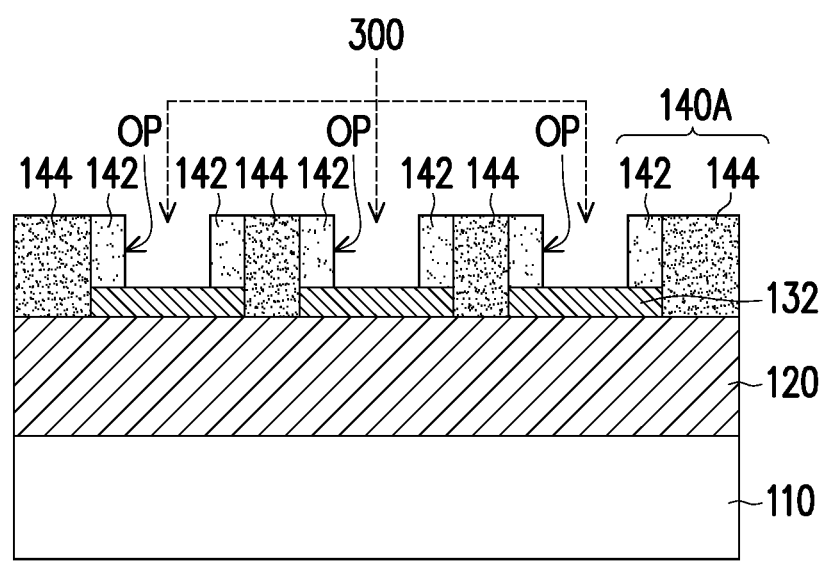

Next, referring to FIG. 8E, the developer 300 may be provided to remove part of the photoresist layer 140 to form the openings OP to expose the electrodes 132 of the electrode pattern layer 130. Referring to both FIG. 8D and FIG. 8E, in the embodiment, due to the thermal diffusion of the second imprinting device 504, part of the first photoresist pattern 142 located near the second photoresist pattern 144 receives heat and further undergoes the polymerization reaction, so when the developer 300 is adopted to remove the photoresist layer 140, the part of the first photoresist pattern 142 is retained to form the openings OP as shown in FIG. 8E (corresponding to the position where the light-emitting element 150 is disposed).

In another embodiment, the first imprinting device 502 as shown in FIG. 8C can be further patterned, then another first imprinting device (not shown) is formed, and the middle part formed at the contact position 502A is not in contact with the photoresist layer 140. The middle part of the another first imprinting device (not shown) corresponds to the position where the formed opening OP is disposed in the subsequent process and is not in contact with the photoresist layer 140. Similarly, the another first imprinting device (not shown) can be adopted to perform the imprinting process as shown in FIG. 8C; next, the second imprinting device 504 can be adopted to perform the imprinting process as shown in FIG. 8D; and subsequently, the developer 300 is adopted to perform the process of removing the photoresist layer as shown in FIG. 8E. Accordingly, the openings OP as shown in FIG. 8E (corresponding to the position where the light-emitting element 150 is disposed) can also be formed.

In the embodiment of FIG. 8A to FIG. 8E, the contact-type high-temperature patterning machine is adopted to imprint the photoresist layer 140 to process the first photoresist pattern 142 and the second photoresist pattern 144 in the photoresist layer 140. In the subsequent manufacturing process, the small-sized light-emitting elements 150 (e.g. Micro LEDs or Mini LEDs) can be well disposed on the photoresist pattern layer 140A with a flat topography.

Based on the above, the display device of the embodiments in the disclosure has the flat photoresist pattern layer 140A, so the light-emitting element 150 can be stably held on the photoresist pattern layer 140A. When the mass transferring process and the bonding process are performed on the multiple light-emitting elements 150, the yield of the electrical connection between the light-emitting elements 150 and the electrodes 132 may be improved.

Moreover, the manufacturing method of the display device of the embodiments in the disclosure can be adopted to process the photoresist pattern layer 140A in the array fab. That is, the photoresist pattern layer 140A can be processed without the transfer to the color filter fab, so the cost is saved. In addition, since black metal is not required, no effect of parasitic capacitance is caused, and the photomask process can be omitted.

Although the disclosure has been described with reference to the above embodiments, they are not intended to limit the disclosure. It will be apparent to one of ordinary skill in the art that modifications and changes to the described embodiments may be made without departing from the spirit and the scope of the disclosure. Accordingly, the scope of the disclosure will be defined by the attached claims and their equivalents and not by the above detailed descriptions.

What is claimed is:

1. A display device, comprising a display area and a non-display area, wherein the display device comprises:
   a substrate;
   an element layer disposed on the substrate;
   an electrode pattern layer disposed on the element layer, wherein the electrode pattern layer comprises a plurality of electrodes;
   a photoresist pattern layer disposed on the electrode pattern layer and comprising:
      a first photoresist pattern disposed corresponding to the display area and corresponding to the plurality of the electrodes, and
      a second photoresist pattern disposed corresponding to the non-display area and between the plurality of the electrodes; and
   at least one light-emitting element disposed on the photoresist pattern layer and electrically connected to the plurality of the electrodes of the electrode pattern layer,
   wherein a height of the first photoresist pattern is equal to a height of the second photoresist pattern, and the light-emitting element is disposed on a plane of the photoresist pattern layer formed by the first photoresist pattern and the second photoresist pattern.

2. The display device according to claim 1, wherein the photoresist pattern layer comprises an opening to expose the plurality of the electrodes of the electrode pattern layer, and
the light-emitting element is electrically connected to the plurality of the electrodes of the electrode pattern layer through the opening.

3. The display device according to claim 1, wherein transmittance of a visible light region of the first photoresist pattern ranges from 25% to 100%.

4. The display device according to claim 1, wherein reflectivity of a visible light region of the first photoresist pattern is less than or equal to 20%.

5. The display device according to claim 1, wherein transmittance of a visible light region of the second photoresist pattern ranges from 0% to 40%.

6. The display device according to claim 1, wherein reflectivity of a visible light region of the second photoresist pattern is less than or equal to 15%.

7. The display device according to claim 1, wherein the light-emitting element comprises a micro light-emitting diode (Micro LED) or a sub-millimeter light-emitting diode (Mini LED).

8. The display device according to claim 1, wherein a material of the photoresist pattern layer is selected from ionomer resin, thermally sensitive resin, thermosetting resin, hydrocarbon resin, acrylonitrile butadiene styrene resin, acrylic resin, fluorocarbon resin, acetal resin, epoxide resin, ion exchange resin, ionic polymer, amino resin, furfural resin, furfural phenol resin, phenolic resin, phenol ether resin, urea-formaldehyde resin, urea resin, carbamide resin, polyvinyl chloride, polyethylene terephthlate, polyamide, ethylene-vinyl alcohol copolymer, ethylene-propylene copolymer, ethylene-tetrafluoroethylene copolymer, melamine-phenol-formaldehyde resin, and combinations thereof.

9. A manufacturing method of a display device, wherein the display device comprises a display area and a non-display area, and the manufacturing method of the display device comprises:
   disposing a substrate;
   forming an element layer on the substrate;
   forming an electrode pattern layer on the element layer, wherein the electrode pattern layer comprises a plurality of electrodes;
   forming a photoresist layer on the electrode pattern layer;
   providing first energy to the photoresist layer corresponding to the display area to form a first photoresist pattern, wherein the first photoresist pattern is formed corresponding to the plurality of the electrodes;

providing second energy to the photoresist layer corresponding to the non-display area to form a second photoresist pattern, wherein the second photoresist pattern is formed between the plurality of the electrodes, and the first photoresist pattern and the second photoresist pattern form a photoresist pattern layer; and disposing a light-emitting element on the photoresist pattern layer, wherein the light-emitting element is electrically connected to the plurality of the electrodes of the electrode pattern layer, wherein a height of the first photoresist pattern is equal to a height of the second photoresist pattern, and the light-emitting element is disposed on a plane of the photoresist pattern layer formed by the first photoresist pattern and the second photoresist pattern.

10. The manufacturing method of the display device according to claim 9, wherein a first laser with the first energy is disposed, the photoresist layer is scanned to form the first photoresist pattern, and an energy range of the first laser ranges from 20 J/g to 400 J/g; and a second laser with the second energy is disposed, the photoresist layer is scanned to form the second photoresist pattern, and an energy range of the second laser ranges from 300 J/g to 100 J/g.

11. The manufacturing method of the display device according to claim 9, wherein a first imprinting device with the first energy is disposed, the photoresist layer is imprinted to form the first photoresist pattern, and a temperature of the first imprinting device ranges from 120° C. to 200°; and a second imprinting device with the second energy is disposed, the photoresist layer is imprinted to form the second photoresist pattern, and a temperature of the second imprinting device ranges from 150° C. to 300°.

12. The manufacturing method of the display device according to claim 11, further comprising:

performing a baking process on the photoresist layer, wherein a temperature of the baking process ranges from 80° C. to 110° C.; and imprinting the photoresist layer through the first imprinting device and imprinting the photoresist layer through the second imprinting device after the baking process.

13. The manufacturing method of the display device according to claim 9, further comprising:

providing a developer to remove part of the photoresist layer and to form an opening to expose the plurality of the electrodes of the electrode pattern layer, wherein the light-emitting element is electrically connected to the plurality of the electrodes of the electrode pattern layer through the opening.

14. The manufacturing method of the display device according to claim 9, wherein transmittance of a visible light region of the first photoresist pattern ranges from 25% to 100%.

15. The manufacturing method of the display device according to claim 9, wherein reflectivity of a visible light region of the first photoresist pattern is less than or equal to 20%.

16. The manufacturing method of the display device according to claim 9, wherein transmittance of a visible light region of the second photoresist pattern ranges from 0% to 40%.

17. The manufacturing method of the display device according to claim 9, wherein reflectivity of a visible light region of the second photoresist pattern is less than or equal to 15%.

18. The manufacturing method of the display device according to claim 9, wherein a material of the photoresist pattern layer is selected from ionomer resin, thermally sensitive resin, thermosetting resin, hydrocarbon resin, acrylonitrile butadiene styrene resin, acrylic resin, fluorocarbon resin, acetal resin, epoxide resin, ion exchange resin, ionic polymer, amino resin, furfural resin, furfural phenol resin, phenolic resin, phenol ether resin, urea-formaldehyde resin, urea resin, carbamide resin, polyvinyl chloride, polyethylene terephthlate, polyamide, ethylene-vinyl alcohol copolymer, ethylene-propylene copolymer, ethylene-tetrafluoroethylene copolymer, melamine-phenol-formaldehyde resin, and combinations thereof.

* * * * *